United States Patent

Ishida et al.

[11] Patent Number: 5,259,155
[45] Date of Patent: Nov. 9, 1993

[54] BONDER TOOL CLEANING MECHANISM

[75] Inventors: Hisao Ishida, Saitama; Akihiro Nishimura; Koji Sato, both of Tokyo, all of Japan

[73] Assignee: Kabushiki Kaisha Shinkawa, Tokyo, Japan

[21] Appl. No.: 879,573

[22] Filed: May 7, 1992

Related U.S. Application Data

[63] Continuation of Ser. No. 616,194, Nov. 20, 1990, abandoned.

[51] Int. Cl.⁵ .............................................. B24B 7/16
[52] U.S. Cl. .................................. 51/3; 51/262 A; 51/57; 51/273; 51/326
[58] Field of Search ............... 51/5 R, 5 F, 3, 4, 326, 51/327, 328, 67, 62, 59 R, 57, 73 R, 262 T, 262 A, 273

[56] References Cited

U.S. PATENT DOCUMENTS

| 762,180 | 6/1904 | Michou | 51/59 R |
|---|---|---|---|
| 2,284,483 | 5/1942 | Whitesell, Jr. | 51/73 R |
| 4,668,136 | 5/1987 | Santa | 51/73 R |

FOREIGN PATENT DOCUMENTS

| 0246643 | 5/1984 | Japan | |
| 0016956 | 1/1988 | Japan | 51/118 |
| 3161272 | 7/1991 | Japan | 51/262 A |

*Primary Examiner*—Robert A. Rose
*Attorney, Agent, or Firm*—Koda and Androlia

[57] ABSTRACT

In a bonder tool cleaning mechanism in a bonding machine, a coarse grindstone, a finishing grindstone and a wire brush are provided on a cleaning section, and when a bonding tool is moved above the cleaning section and then moved down to come into contact with the grindstones and brush, the cleaning section oscillates horizontally so that grindstones and brush clean the bonding tool.

1 Claim, 3 Drawing Sheets

BONDER TOOL CLEANING MECHANISM

This is a continuation of application Ser. No. 616,194, filed Nov. 20, 1990, now abandoned.

BACKGROUND OF THE INVENTION

1. Field of the Invention

The present invention relates to a bonder tool cleaning mechanism for use in inner lead bonders, outer lead bonders, bump transfer bonders, pellet bonders, etc.

2. Prior Art

One example of conventional bonder tool cleaning mechanisms is provided with a wire brush and a finishing grindstone as disclosed in Japanese Patent Application Kokai (Laid-Open) No. 60-246643. In this mechanism, the wire brush is applied first, and then cleaning is performed using the finishing grindstone. Since this mechanism has one wire brush and one finishing grindstone, oxides adhering to the undersurface of the bonding are not removed completely.

Specifically, most of the oxides are removed by the initial application of the wire brush; however, the oxides are not completely removed. Since cleaning is then performed using the finishing grindstone, remaining oxides would cause clogging. In addition, foreign substances generated by this cleaning job are pushed out onto the side surfaces of the tool and left there.

When foreign substances, such as oxides, etc. adhering to the tool remain, thermal conductivity of the tool deteriorates, resulting in leads and bumps that are not connected completely.

SUMMARY OF THE INVENTION

Accordingly, the object of the present invention is to provide a bonder tool cleaning mechanism which completely removes foreign substances such as oxides, etc. adhering to a bonder tool.

The object of the present invention is accomplished by a unique structure for a cleaning assembly made up with, at least, a coarse grindstone, a finishing grindstone and a wire brush.

With this cleaning assembly, clogging, for example, caused by oxides on the undersurface of the tool is prevented by cleaning the tool with the coarse grindstone. Then, a finishing cleaning is performed using the finishing grindstone. By these cleaning processes, the undersurface of the tool is cleaned, but as a result of such two cleaning actions, foreign substances, such as oxides, etc., which had adhered to the undersurface of the tool, are pushed out onto the side surfaces of the tool. Accordingly, the wire brush is applied to the tool at the end of the cleaning job so that foreign substances, (such as oxides, etc.) on the side surface and undersurface of the bonder tool are removed.

DETAILED DESCRIPTION OF THE INVENTION

Figure 1:
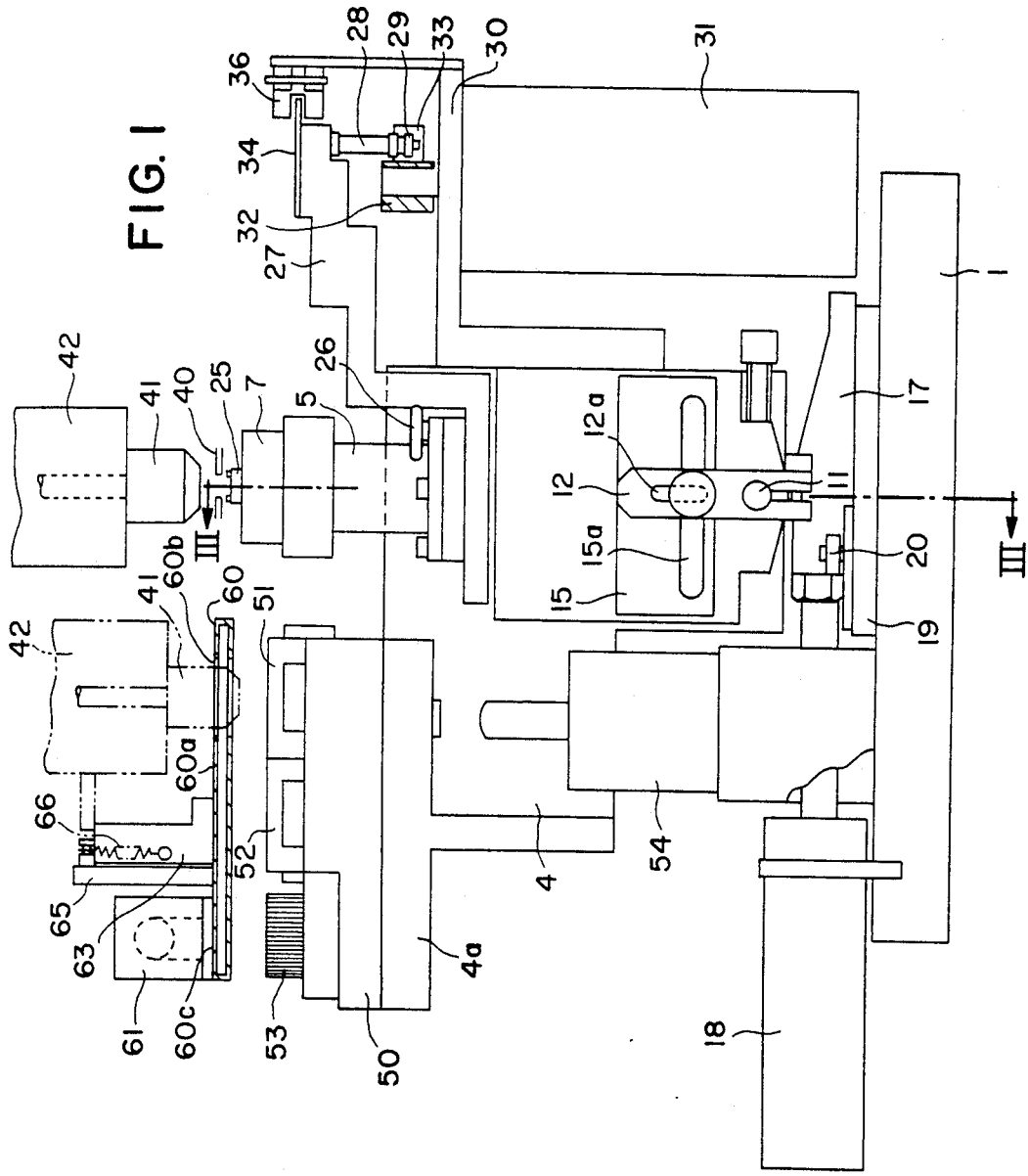
FIG. 1 is a partially cross-sectional front view of one embodiment of the present invention.
Figure 2:
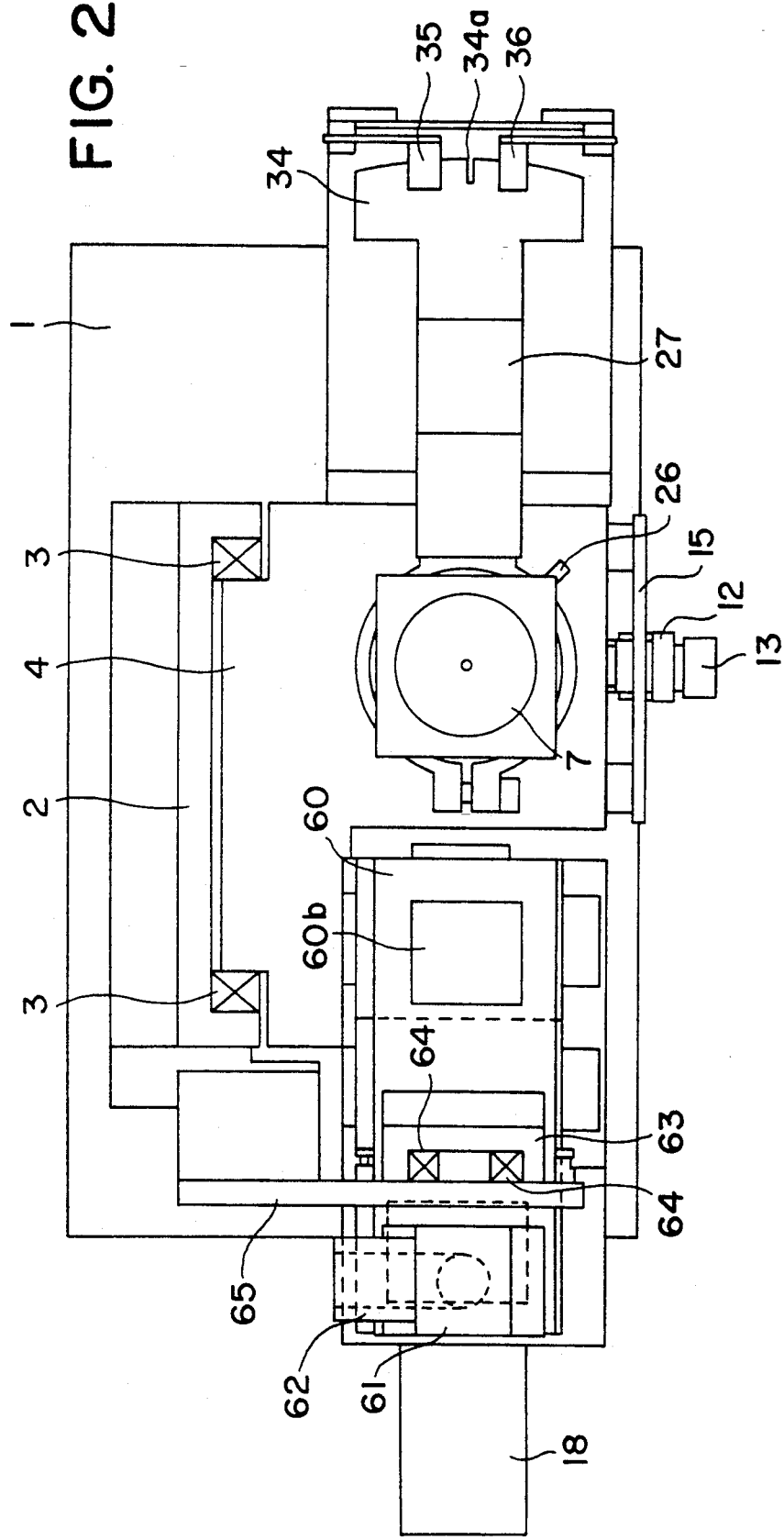
FIG. 2 is plan view of FIG. 1.
Figure 3:
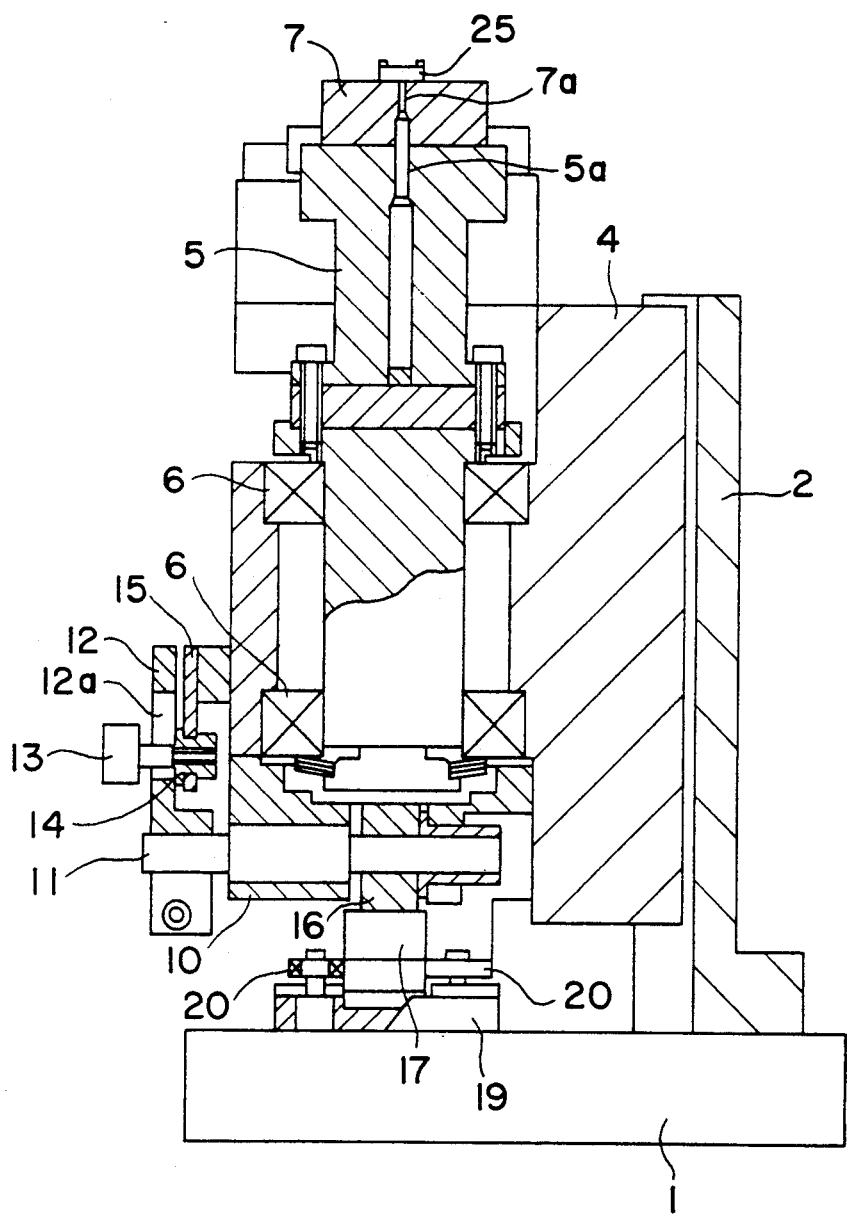
FIG. 3 is a cross sectional view taken along line III—III of FIG. 1.

One embodiment of the present invention will be described with reference to the accompanying drawings.

An XY table 1 has a supporting block 2 thereon. The XY table 1 is of a known structure and driven in the X and Y directions by appropriate driving means (not shown).

A vertically movable block 4 is mounted to the supporting block 2 with cross rollers 3 provided therebetween (the rollers being installed in a perpendicular configuration) so that the block 4 is free to move up and down.

A stage supporting shaft 5 is installed in an upright position on the vertically movable block 4 and is supported by bearings 6 so that the shaft 5 is free to rotate. A bonding stage 7 is provided on the upper surface of this stage supporting shaft 5.

A shaft holder 10 is fixed to the vertically moving block 4, and an eccentric shaft 11 is supported in the shaft holder 10 so that the shaft 11 is free to rotate. The eccentric shaft 11 is positioned horizontally so that its position can be adjusted in a vertical direction.

An adjustment lever 12 is fastened to the end of the eccentric shaft 11, and a vertical groove 12a is formed in this adjustment lever 12. The shaft portion of a locking screw 13 is inserted in this vertical groove 12a. The threaded portion of this locking screw 13 is engaged with a nut 14 which is loosely held in horizontal groove 15a formed in a supporting plate 15. This supporting plate 15 is attached to the vertically moving block 4.

A cam follower 16 is provided on the eccentric shaft 11. This cam follower 16 contacts a linear cam 17 which has a cam surface formed on its upper surface. The linear cam 17 is caused to move horizontally by an air cylinder 18 which is fixed on the XY table 1.

A guide block 19 which guides the bottom surface of the linear cam 17 is fixed to the surface of the XY table 1 at a position facing the linear cam 17. Guide rollers 20 which guide both side surfaces of the linear cam 17 are supported on this guide block 19 so that the rollers 20 are free to rotate.

When the locking screw 13 is loosened and the adjustment lever 12 is turned, the eccentric shaft 11 rotates. This causes the stage supporting shaft 5 and bonding stage 7 to move vertically (up and down) along with the vertically movable block 4. Thus, the position of the bonding stage 7 with respect to the vertical direction (or the height of the stage 7) can be adjusted.

When the air cylinder 18 is activated, the movable block 4 moves vertically (together with the cam follower 16) along the cam surface of the linear cam 17. The bonding stage 7 is thus moved up and down.

In the upper area of the stage supporting shaft 5 and in the bonding stage 7 are provided suction adhesion holes 5a and 7a, respectively. These suction adhesion holes hold a pellet 25. A pipe 26 through which vacuum suction is applied by a vacuum source (not shown) is connected to the suction adhesion hole 5a.

An adjustment lever 27 is fastened to the stage supporting shaft 5 so as to adjust the rotational direction of the pellet 25. A shaft 28 (which extends vertically downward) is provided on the undersurface of the end portion of the adjustment lever 27, and a roller 29 is rotatably supported on the lower end of this shaft 28.

A motor bracket 30 is provided on the vertically movable block 4, and a motor 31 is mounted on this motor bracket 30. A block 32 is attached to the output shaft of the motor 31, and two rollers 33 (only one of these rollers 33 is shown in FIG. 1) are rotatably supported by this block 32 so that the rollers 33 clamp the roller 29 therebetween.

A detection plate 34 which has a slit 34a is fastened to the upper surface of the end portion of the adjustment lever 27. So as to control the rotational range of the detection plate 34 (i.e. the range of rotation of the adjustment lever 27), two photo sensors 35 and 36, which detect the slit 34a of the detection plate 34, are fixed to the motor bracket 30.

When the motor 31 rotates, the rollers 29, shaft 28 and adjustment lever 27 rotate (via the block 32 and roller 33) about the center of the stage supporting shaft 5. As a result, the stage supporting shaft 5 is caused to rotate, and the position of the pellet 25 in the rotational direction is corrected.

The bonding operation by means of the above-described bonder will be explained below.

When the pellet 25 is placed on the bonding stage 7 (by a means not shown in the drawing), vacuum suction is applied to the suction adhesion hole 7a, and the pellet 25 is held on the bonding stage 7. Then, the position of the pellet 25 is detected by a camera (not shown), and the rotational position of the pellet 25 with respect to leads 40 installed on a film carrier (not shown) is corrected by rotating the motor 31. The XY table is driven in the X and Y directions so that the XY position of the pellet 25 with respect to the leads 40 is corrected.

Next, the tool 41 (which is driven vertically and in the X and Y directions by a driving means not shown in the drawing) is lowered, and the air cylinder 18 is actuated so that the bonding stage 7 rises as described above. As a result, leads 40 are bonded to the bumps of the pellet 25. Afterward, the tool 41 is raised, and the bonding stage 7 is lowered.

The tool cleaning mechanism which is installed in the bonder above and a feature of the present invention will be described below.

The vertically movable block 4 has a cleaning section 4a which is located on one side of the stage supporting shaft 5, and a cleaning base 50 is provided on this cleaning section 4a.

On the cleaning base 50 are provided the following three elements: a coarse grindstone 51 with a coarse grain size (consisting of silicon carbide, for example), a finishing grindstone 52 with a fine grain size (consisting of a ceramic, for example), and a wire brush 53.

A cylinder 54 is provided on the XY table 1 so that the cylinder 54 faces the undersurface of the cleaning section 4a.

A duct 60 which has a suction channel 60a with its periphery sealed is installed above the coarse grindstone 51, finishing grindstone 52 and wire brush 53.

The duct 60 has a tool insertion hole 60b and an opening 60c. The insertion hole 60b is opened in the duct 60 so that the tip end of the tool 41 is inserted in the hole 60b. The opening 60c is connected with the suction channel 60a.

A hose connecting pipe 62 is attached to an area of the opening 60c through a connecting block 61. The hose connecting pipe 62 is connected to a vacuum apparatus via a drain hose (not shown).

The duct 60 is fixed to a duct supporting plate 63, and this duct supporting plate 63 is installed on a fastening plate 65 via cross rollers 64 so that the duct supporting plate 63 is movable up and down. Moreover, the duct supporting plate 63 is urged upward by a spring 66 and fastened to the supporting block 2.

The operation of the above-described tool cleaning mechanism will be described below.

After bonding the leads 40 of the film carrier to the bumps of the pellet 25 (as described above) for predetermined times, the tool 41 is positioned above the tool insertion hole 60b of the duct 60. The XY table 1 is driven so that the coarse grindstone 51 is positioned beneath the tool insertion hole 60b.

The cylinder 54 is next actuated so that the cleaning section 4a of the vertically movable block 4 is pushed upward slightly. The tool 41 is lowered so that the lower end of the tool 41 comes into contact with the coarse grindstone 51.

When the tool 41 is lowered, the duct supporting plate 63, i.e., the duct 60, is pushed downward by the tool holder 42 that holds the tool 41. As a result, the undersurface of the duct 60 is positioned slightly away from the coarse grindstone 51. With this state, the XY table 1 is reciprocated (on the XY plane) for a predetermined period of time, preventing clogging of oxides adhering to the undersurface of the tool 41.

The tool 41 is then raised, and the XY table 1 is driven so that the finishing grindstone 52 is positioned again beneath the tool insertion hole 60b. Then, the tool 41 is again lowered, and the XY table 1 is reciprocated (on the XY plane) for a predetermined period of time in the same manner as described above. Thus, the finishing cleaning of undersurface of the tool 41 is completed.

Afterward, the tool 41 is again raised, and the XY table 1 is driven so that the wire brush 53 is positioned beneath the tool insertion hole 60b. After this, the tool 41 is again lowered. Then, the XY table 1 is reciprocated (in the XY direction) for a predetermined period of time. Thus, oxides adhering to the side surfaces and undersurface of the tool 41 as a result of the cleaning performed by the coarse grindstone 51 and finishing grindstone 53 are removed.

Afterward, the tool 41 is raised and driven on the XY plane so that the tool 41 is positioned above the bonding station. The actuating rod of the cylinder 54 is retracted, and the vertically movable block 4 is lowered. The XY table 1 is driven so that the bonding stage 7 is positioned at the bonding station.

The powdered substance removed by the coarse grindstone 51, finishing grindstone 52, and wire brush 53 is sucked out though the duct 60. Accordingly, dust is prevented from scattering. Since the duct 60 surrounds the tool 41, the dust is effectively sucked into the duct 60.

In the embodiment described above, the cleaning section 4a is installed on the vertically movable block 4. However, the cleaning section 4a and the vertically movable block 4 can be provided separately so that the cleaning section is driven by another XY table.

Furthermore, in the above described embodiment, the present invention is described with reference to inner lead bonding. However, it goes without saying that the present invention can be applied to outer lead bonding, transfer bump bonding, etc. In addition, though two types of grindstones (the coarse grindstone 51 and finishing grindstone 52) are used in the embodiment, an intermediate grindstone can be added to these grindstones.

According the present invention, as is clear from the above description, the cleaning sections includes at least a coarse grindstone, a finishing grindstone and a wire brush. Accordingly, foreign substance such as oxides, etc. adhering to the bonder tool can be completely removed, and a stable bonding can be performed.

We claim:

1. A bonder tool cleaning mechanism for use in a semiconductor bonder of the type which comprises a bonding stage that positions and carries bumps and a bonder tool which pressure-bonds leads of a film carrier to said bumps, said bonder tool cleaning mechanism comprising at least a coarse grindstone, a finishing grindstone, and wire brush provided in the vicinity of said bonding stage and an X Y table for moving successively said coarse grindstone, finishing grindstone and wire brush into contact with said bonding tool and then for reciprocating successively in an X Y plane each of said coarse grindstone, finishing grindstone and wire brush to clean said bonding tool.

* * * * *